United States Patent
Kang et al.

(10) Patent No.: US 7,492,645 B2
(45) Date of Patent: Feb. 17, 2009

(54) INTERNAL VOLTAGE GENERATOR FOR SEMICONDUCTOR MEMORY DEVICE

(75) Inventors: Khil-Ohk Kang, Kyoungki-do (KR); Young-Hoon Oh, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 21 days.

(21) Appl. No.: 11/527,440

(22) Filed: Sep. 27, 2006

(65) Prior Publication Data

US 2007/0070723 A1    Mar. 29, 2007

(30) Foreign Application Priority Data

Sep. 29, 2005   (KR)   ................ 10-2005-0091565
Apr. 28, 2006   (KR)   ................ 10-2006-0038700

(51) Int. Cl.
    *G11C 5/14*    (2006.01)
(52) U.S. Cl. .............. 365/189.09; 365/226; 365/148; 365/210.12
(58) Field of Classification Search ........... 365/189.09, 365/226, 148, 210.12
    See application file for complete search history.

(56) References Cited

U.S. PATENT DOCUMENTS

| | | | |
|---|---|---|---|
| 4,347,058 A | | 8/1982 | Polito et al. |
| 5,736,869 A | * | 4/1998 | Wei .................. 326/81 |
| 5,841,618 A | * | 11/1998 | Dilkes et al. .......... 361/110 |
| 5,966,337 A | | 10/1999 | Lee et al. |
| 5,986,954 A | * | 11/1999 | Pascucci .............. 365/203 |
| 6,043,685 A | | 3/2000 | Lee |
| 6,097,653 A | | 8/2000 | Park |
| 6,362,697 B1 | * | 3/2002 | Pulvirenti ............. 331/111 |
| 2003/0071679 A1 | * | 4/2003 | Kono et al. ............ 327/538 |
| 2005/0073356 A1 | * | 4/2005 | Won .................. 327/541 |

FOREIGN PATENT DOCUMENTS

| | | |
|---|---|---|
| JP | 10-340583 | 12/1998 |
| KR | 2003-0053923 | 7/2003 |
| KR | 10-2004-0051672 | 6/2004 |

OTHER PUBLICATIONS

Korean Office Action issued in corresponding Korean Patent Application No. KR 10-2006-0038700, dated Apr. 24, 2007.

* cited by examiner

*Primary Examiner*—Thong Q Le
(74) *Attorney, Agent, or Firm*—McDermott Will & Emery LLP

(57) ABSTRACT

An internal voltage generator for a semiconductor memory device is provided. The internal voltage generator includes a first reference voltage generator for generating a first reference voltage, a second reference voltage generator for generating a second reference voltage, a core voltage generator for raising a core voltage based on the first reference voltage, and a core voltage discharger for discharging the core voltage depending on the second reference voltage.

10 Claims, 8 Drawing Sheets

INTERNAL VOLTAGE GENERATOR FOR SEMICONDUCTOR MEMORY DEVICE

FIELD OF THE INVENTION

The present invention relates to semiconductor design technologies, and more particularly, to an internal voltage generator for a semiconductor memory device for stably generating a core voltage applied to its internal circuits.

BACKGROUND

As well-known in the art, cell size within a semiconductor memory chip has become smaller as the chip is more highly integrated. Also, the operating voltage decreases due to meet requirements of the smaller-sized cell. Most semiconductor memory chips employ an operating voltage derived from an external power supply voltage VDD, but such a power supply voltage may introduce noise or change in its level. Therefore, an internal voltage generator has been provided within a chip to generate a stable internal voltage, in which a stable operation is always performed even in change of the external power supply voltage.

FIG. 1 is a block diagram of a conventional internal voltage generator.

Referring to FIG. 1, the internal voltage generator 20 for applying a core voltage VCORE to an internal circuit 10 includes a sense amplifier over driving portion 21, a core voltage supplier 22, a core voltage discharger 23 and a reference voltage generator 24.

Prior to describing the operation, various signals used therein are first defined as follows. An external voltage VR, which is a high voltage that may vary with a process, is divided to provide several reference voltages. A division control signal TRIM refers to a control signal to generate a constant supply reference voltage VREF based on the external voltage VR. The supply reference voltage VREF generally has ½ voltage level of required target value of the core voltage VCORE.

The circuit configurations of the sense amplifier over driving portion 21, the core voltage supplier 22 and the core voltage discharger 23 are already well-known in the art, and thus, details thereof will be omitted. The circuit configuration of the reference voltage generator 24 that is related to the present invention, however, will be illustrated below.

The following is a brief operation description of the sense amplifier over driving portion 21, the core voltage supplier 22 and the core voltage discharger 23.

The sense amplifier over driving portion 21 serves to apply a short circuit connection between an external power supply voltage VDD and the core voltage end VCORE and then apply the external power supply voltage VDD directly to the core voltage end VCORE so that sufficient core voltage VCORE is supplied to the internal circuit 10 when an activation signal Act (not shown) for activating the operation of Dynamic Random Access Memory (DRAM) is applied thereto.

The core voltage supplier 22 compares the supply reference voltage VREF with ½ voltage level of the core voltage VCORE (hereinafter, "half core voltage") and charges the core voltage VCORE when the half core voltage is lower than the supply reference voltage VREF.

The core voltage discharger 23 compares the supply reference voltage VREF with the half core voltage and discharges the core voltage VCORE when the half core voltage is higher than the supply reference voltage VREF.

The reference voltage generator 24 divides the external voltage VR and provides a required voltage level among the divided external voltages as the supply reference voltage VREF in response to the division control signal TRIM.

FIG. 2 is a detailed circuit diagram of the reference voltage generator 24 shown in FIG. 1.

With reference to FIG. 2, the reference voltage generator 24 is provided with a voltage divider 27 for receiving and dividing an external voltage VR, and a reference voltage output portion 28 for providing one of voltage levels at nodes N1 to N3 of the voltage divider 27 as the supply reference voltage VREF depending on first to third division control signals TRIM1 to TRIM3.

To be more specific, the voltage divider 27 is composed of a plurality of resistors R1 to R4 connected in series between the external voltage end VR and a ground voltage end VSSA, and provides divided voltages into which the external voltage VR is divided at each of the nodes N1 to N3.

The reference voltage output portion 28 is composed of inverters INV1 to INV3 that receive the first to third division control signal TRIM1 to TRIM3, and first to third transfer gates G1 to G3 for outputting any one of the voltage levels at the first to third nodes N1 to N3 as the discharge reference voltage VREF in response to the first to third division control signal TRIM1 to TRIM3 and respective corresponding output signals of the inverters N1 to N3.

For example, if the voltage level at the second node N2 has the supply reference voltage VREF as required, the second division control signal TRIM2 becomes logic high and the first and third division control signals TRIM1 and TRIM3 become logic low. Thus, only the second transfer gate G2 is enabled and the divided external voltage level at the second node N2 is output as the supply reference voltage VREF.

Similarly, the voltage levels at the first node N1 and the third node N3 may be provided as the supply reference voltage VREF as required in response to the first to third division control signals TRIM1 to TRIM3.

FIG. 3 shows a simulation result for the input/output signals of the reference voltage generator 24 shown in FIG. 1. Here, the supply reference voltage VREF is one of the voltages into which the external voltage VR is divided and has a voltage level lower than that of the external voltage VR FIG. 4 is a waveform for describing a change in voltage level of the core voltage VCORE created according to the prior art.

Referring to FIGS. 1 and 4, when an activation signal Act to activate the operation of DRAM is input, the core voltage VCORE is decreased by operation of the internal circuit 10 and the sense amplifier over driving portion 21 and the core voltage supplier 22 charges the decreased core voltage VCORE. In the meantime, the core voltage discharger 23 compares the supply reference voltage VREF with the half core voltage and discharges the core voltage VCORE if the half core voltage is higher than the supply reference voltage.

In other words, it can be seen that the internal voltage generator 20 according to the prior art provides the single supply reference voltage VREF generated by the reference voltage generator 24 to the core voltage supplier 22 and the core voltage discharger 23 as the reference voltage.

Accordingly, when the core voltage VCORE is discharged by the core voltage discharger 23, it is discharged beyond the target value of the core voltage VCORE due to a response speed delay of the core voltage discharger 23. The discharged core voltage VCORE is again charged by the core voltage supplier 22. For the above reason, the core voltage VCORE assumes an unstable, saw tooth like, waveform while repeating the charge and discharge operations.

The external voltage VR that may vary with a process is divided at each of the nodes N1 to N3 of the voltage divider 27 shown in FIG. 2 and a desired voltage level among the divided voltages can be provided as the supply reference voltage VREF as required according to the first to third division control signals TRIM1 to TRIM3.

However, since the core voltage supplier 22 and the core voltage discharger 23 receive the single constant supply reference VREF generated by the reference voltage generator 24, the core voltage VCORE has an unstable voltage level while repeating the charge and discharge operations owing to the response speed delay of the core voltage discharger 23.

SUMMARY OF THE INVENTION

It is, therefore, an object of the present invention to provide an internal voltage generator for a semiconductor memory device which generates a discharge reference voltage in consideration of a response speed delay of a core voltage discharger and applies it thereto to thereby prevent unnecessary charge/discharge operations.

In accordance with one aspect of the present invention, there is provided an internal voltage generator for a semiconductor memory device, including: a reference voltage generator for generating a first reference voltage and a second reference voltage with a voltage level higher than that of the first reference voltage; a core voltage supplier for raising a core voltage based on the first reference voltage; and a core voltage discharger for discharging the core voltage based on the second reference voltage.

In accordance with another aspect of the present invention, there is provided an internal voltage generator for a semiconductor memory device, including: a first reference voltage generator for generating a first reference voltage; a second reference voltage generator for generating a second reference voltage; a core voltage generator for raising a core voltage based on the first reference voltage; and a core voltage discharger for discharging the core voltage depending on the second reference voltage.

The conventional internal voltage generator applies a single reference voltage to a core voltage supplier and a core voltage discharger, which makes a core voltage created by the reference voltage unstable. On the contrary, the internal voltage generator of the present invention provides a supply reference voltage to a core voltage supplier and also a discharge reference voltage higher than the supply reference voltage to a core voltage discharger, thereby generating a more stable core voltage than the prior art generator.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Figure 1:
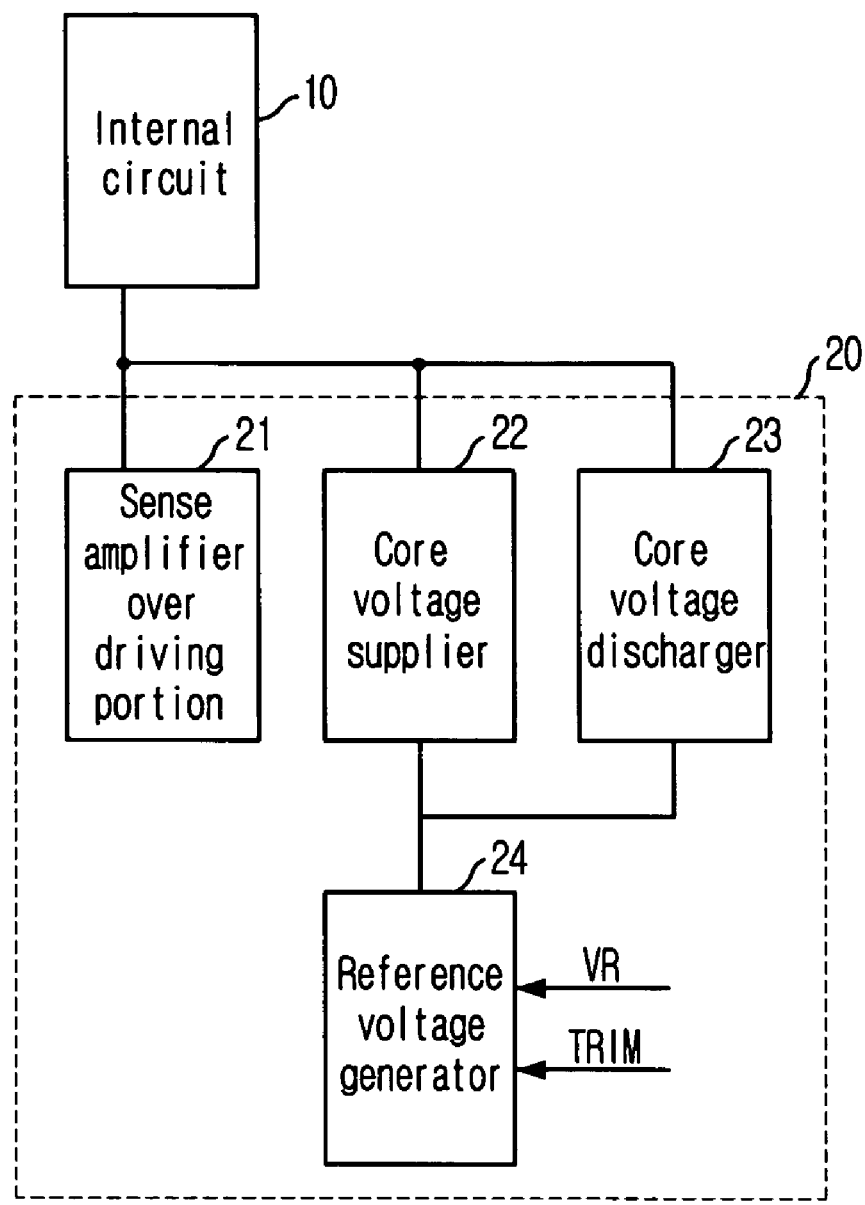
FIG. 1 is a block diagram of a conventional internal voltage generator.
Figure 2:
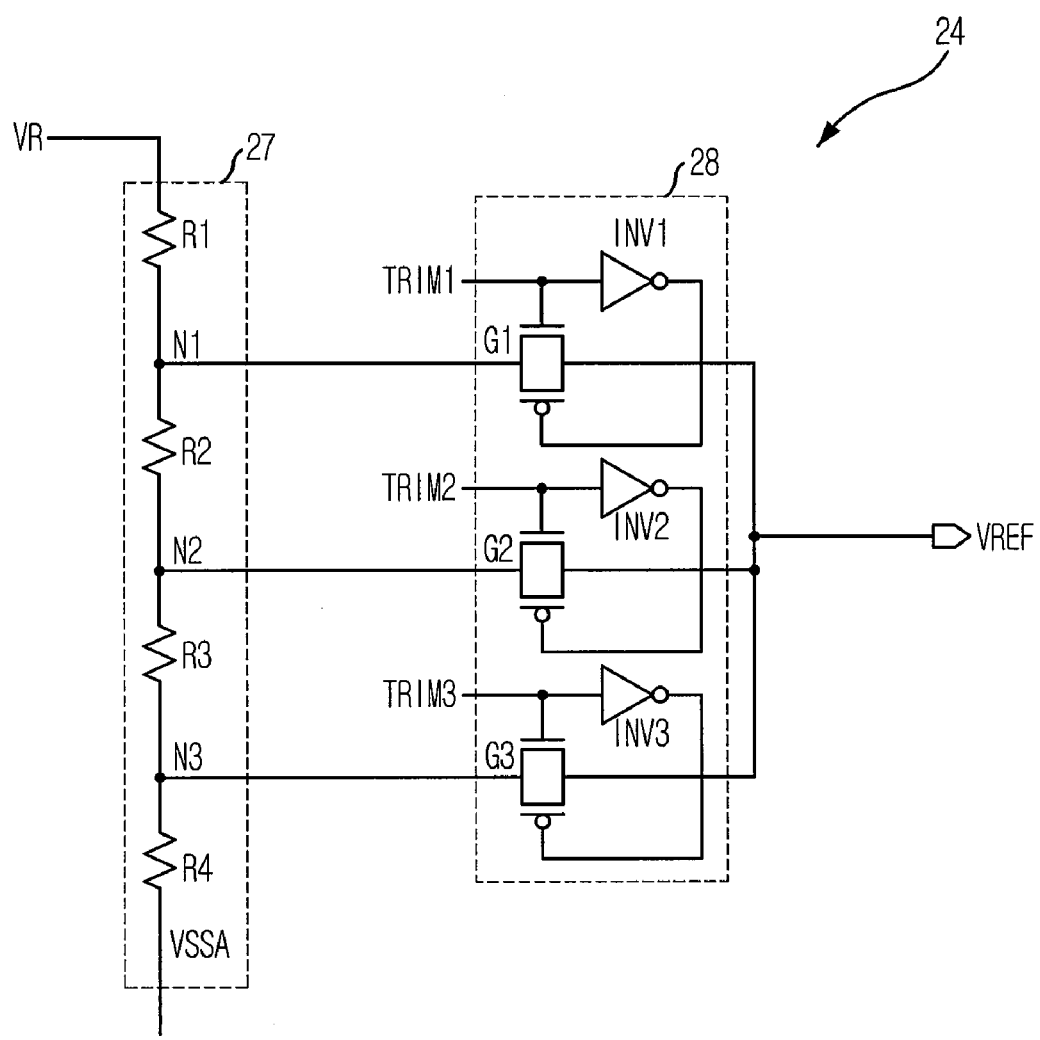
FIG. 2 is a detailed circuit diagram of the reference voltage generator shown in FIG. 1.
Figure 3:
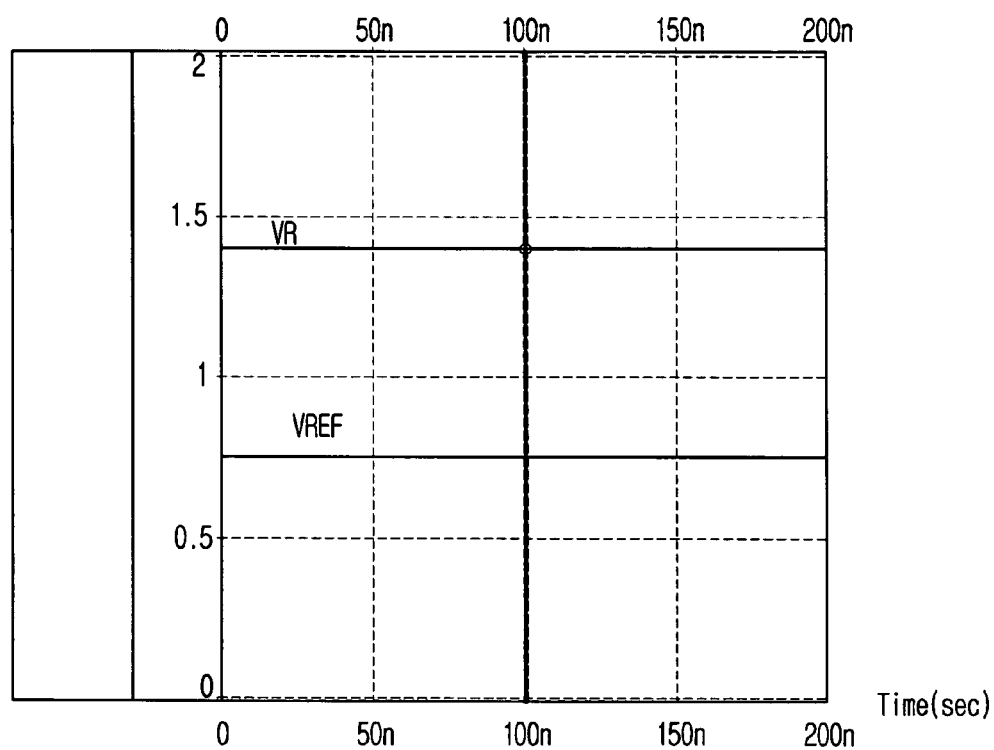
FIG. 3 is a diagram of voltage levels for input/output signals of the reference voltage generator shown in FIG. 1.
Figure 4:
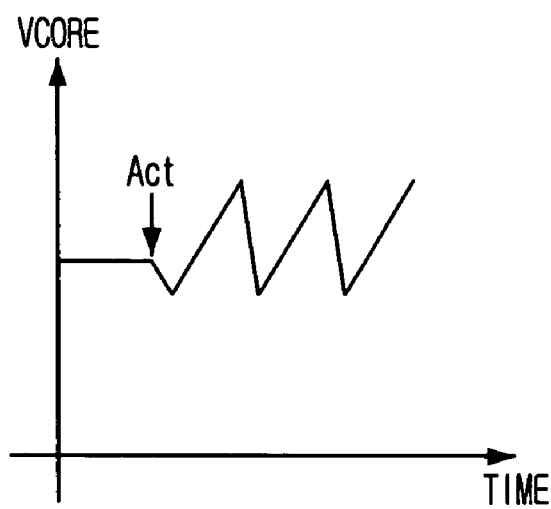
FIG. 4 is a waveform diagram for describing a change in voltage level of the core voltage created according to the prior art.
Figure 5:
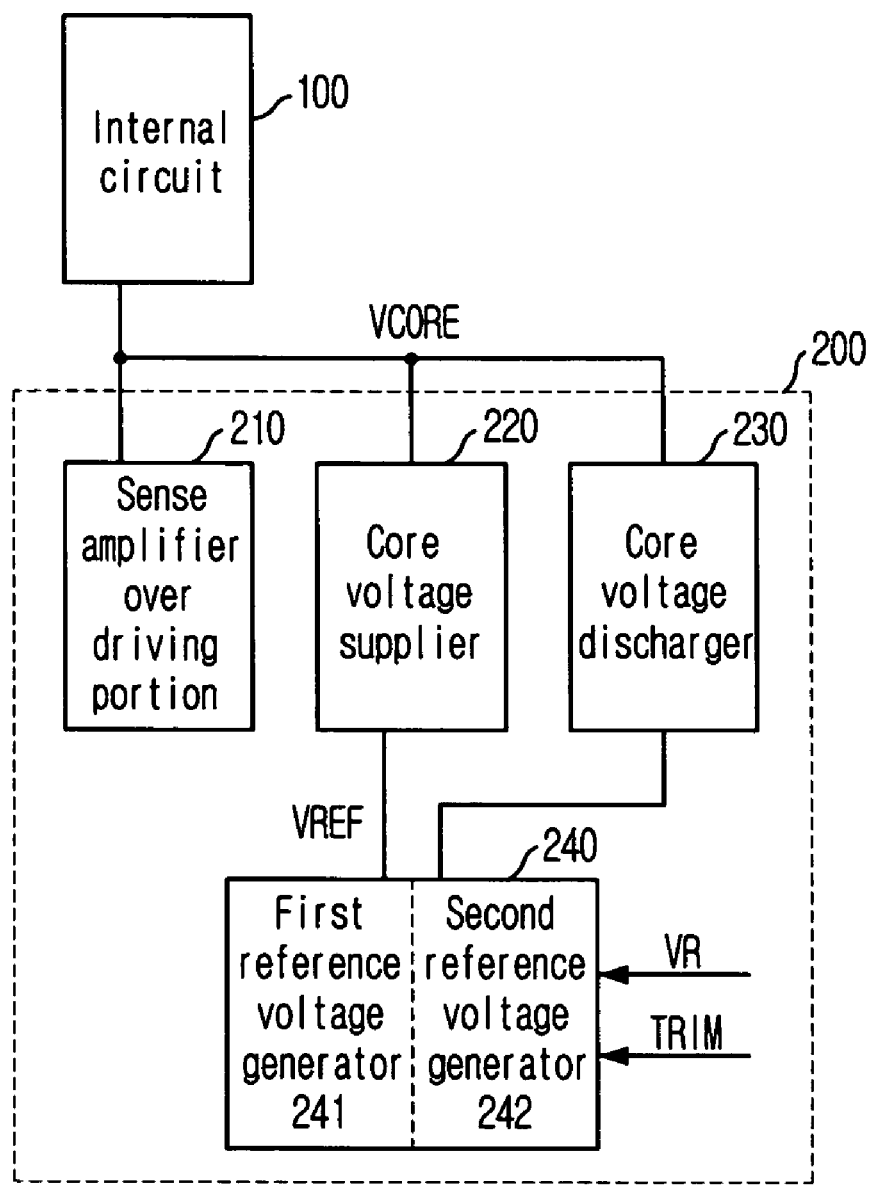
FIG. 5 is a block diagram of an internal voltage generator in accordance with a preferred embodiment of the present invention.

FIG. 5 is a block diagram of an internal voltage generator in accordance with a preferred embodiment of the present invention.

Referring to FIG. 5, the internal voltage generator 200 for applying a core voltage VCORE to an internal circuit 100 includes a sense amplifier over driving portion 210, a core voltage supplier 220, a core voltage discharger 230 and a reference voltage generator 240.

Prior to describing the operation, various signals used therein are first defined as follows. An external voltage VR, which is a high voltage that may vary with a process, is divided to provide several reference voltages. A division control signal TRIM refers to a control signal to generate a constant supply reference voltage VREF and a discharge reference voltage VREFdischarge based on the external voltage VR. The supply reference voltage VREF has ½ voltage level of a required target value of the core voltage VCORE and the discharge reference voltage VREFdischarge has a voltage level higher than the supply reference voltage by a level that takes into account the response speed delay of the core voltage discharger 230.

In operation, the sense amplifier over driving portion 210 serves to apply a short circuit connection between an external power supply voltage VDD and the core voltage end VCORE and then apply it directly to the core voltage end so that the sufficient core voltage VCORE is supplied to the internal circuit 10 when an activation signal Act (not shown) for activating the operation of DRAM is applied thereto.

The core voltage supplier 220 compares the supply reference voltage VREF with ½ voltage level of the core voltage VCORE (hereinafter, "half core voltage") and charges the core voltage VCORE when the half core voltage is lower than the supply reference voltage VREF.

The core voltage discharger 230 compares the discharge reference voltage VREFdischarge with the half core voltage and discharges the core voltage VCORE when the half core voltage is higher than the discharge reference voltage VREFdischarge.

The reference voltage generator 240 is composed of first and second reference voltage generators 241 and 242, and divides the input external voltage VR to provide a required voltage level among the divided external voltages as the supply reference voltage VREF and the discharge reference voltage VREFdischarge in response to the division control signal TRIM.

Figure 6:
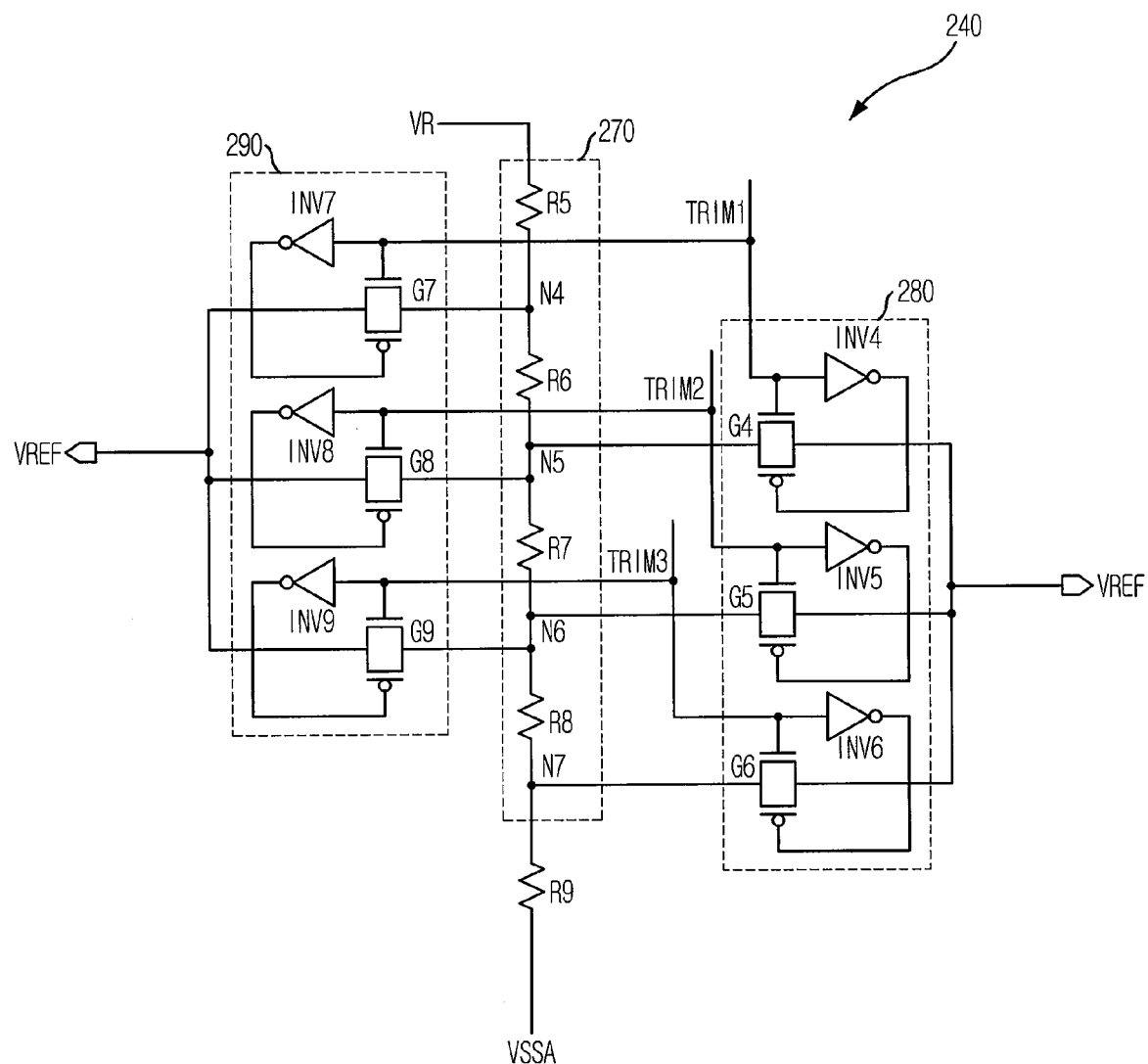
FIG. 6 is a detailed circuit diagram of the reference voltage generator shown in FIG. 5.

FIG. 6 is a detailed circuit diagram of the reference voltage generator 240 shown in FIG. 5.

With reference to FIG. 6, the reference voltage generator 240 is provided with a voltage divider 270 for receiving and dividing an external voltage VR, a reference voltage output portion 280 for providing one of voltage levels at second and fourth nodes N5 to N7 of the voltage divider 270 as the supply reference voltage VREF in response to first to third division control signals TRIM1 to TRIM3, and a discharge reference voltage output portion 290 for providing one of voltage levels at first to third nodes N4 to N6 of the voltage divider 270 as the discharge reference voltage VREFdischarge in response to the first to third division control signals TRIM1 to TRIM3.

More specifically, the voltage divider 270 is composed of a plurality of resistors R5 to R9 connected in series between the external voltage end VR and a ground voltage end VSSA, and provides different divided voltages into which the external voltage VR is divided at each of the nodes N4 to N7.

The supply reference voltage output portion 280 is provided with inverters INV4 to INV6 for receiving the first to third division control signals TRIM1 to TRIM3, and first to third transfer gates G4 to G6 for outputting one of the divided voltages at the second to fourth nodes N5 to N7 as the supply reference voltage VREF in response to the first to third division control signal TRIM1 to TRIM3 and respective corresponding output signals of the inverters INV4 to INV6.

The discharge reference voltage output portion 290 is provided with inverters INV7 to INV9 for receiving the first to third division control signals TRIM1 to TRIM3, and fourth to sixth transfer gates G7 to G9 for outputting one of the divided voltages at the first to third nodes N4 to N6 as the discharge reference voltage VREFdischarge in response to the first to third division control signal TRIM1 to TRIM3 and respective corresponding output signals of the inverters INV7 to INV9.

Although the present invention has been described with respect to the preferred embodiment, it should be noted that the embodiment is for illustration but not for limitation. Further, it will be apparent to those skilled in the art that various changes or modifications may be made within the technical aspect of the present invention.

In operation, the voltage divider 270 accepts the external voltage VR and provides the divided different voltages at each of the nodes N4 to N7 via the resistors R5 to R9 connected in series. The supply reference voltage output portion 280 outputs one of the voltage levels at the second to fourth nodes N5 to N7 as the supply reference voltage VREF in response to the first to third division control signal TRIM1 to TRIM3. The discharge reference voltage output portion 290 provides one of the voltage levels at the nodes N4 to N6 as the discharge reference voltage VREFdischarge in response to the first to third division control signal TRIM1 to TRIM3.

For instance, if the voltage level at the third node N6 has the supply reference voltage VREF as required, the second division control signal TRIM2 becomes logic high and the first and third division control signals TRIM1 and TRIM3 become logic low. Thus, only the second and fifth transfer gate G5 and G8 are enabled and the remaining transfer gates G4, G6, G7 and G9 are disabled, so that the divided voltage level at the third node N6 is output as the supply reference voltage VREF and the voltage level at the second node N5 as the discharge reference voltage VREFdischarge.

It is possible that the external voltage VR rises during the process. In this case, the third division control signal TRIM3 becomes logic high and the first and second division control signals TRIM1 and TRIM2 become logic low. Accordingly, the voltage level at the fourth node N7 is given as the supply reference voltage VREF and the voltage level at the third node N6 as the discharge reference voltage VREFdischarge.

On the contrary, in case where the external voltage VR falls, the first division control signal TRIM1 becomes logic high and the second and third division control signals TRIM2 and TRIM3 become logic low, and thus, the voltage level at the second node N5 is provided as the supply reference voltage VREF and the voltage level at the first node N4 as the discharge reference voltage VREFdischarge.

Figure 7:
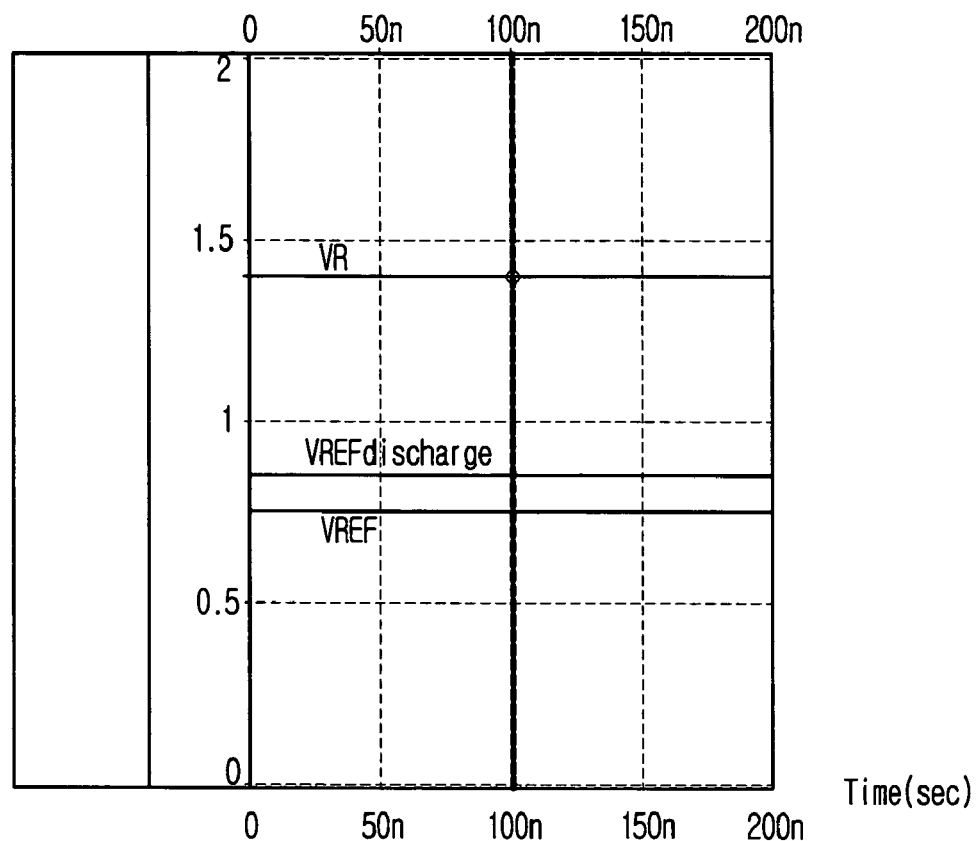
FIG. 7 is a diagram of voltage levels for input/output signals of the reference voltage generator shown in FIG. 6.

FIG. 7 shows voltage of the reference voltage generator 240 shown in FIG. 6.

In FIG. 7, there are shown the external voltage VR, the discharge reference voltage VREFdischarge into which the external voltage VR is divided, the supply reference voltage VREF. It can be seen that the discharge reference voltage VREFdischarge has a voltage level higher than that of the supply reference voltage VREF.

Referring back to FIG. 6, the discharge reference voltage VREFdischarge that is issued by the control of the first to third division control signal TRIM1 to TRIM3 always has a voltage level higher than that of the supply reference voltage VREF. For instance, let's assume that when the external voltage VR is "1.4 V," the voltage into which the external voltage VR is divided at the first node N4 is "1.2 V," the voltage at the second node N5 is "1.0 V," the voltage at the third node N6 is "0.8 V," the voltage at the fourth node N7 is "0.6 V." Then, when the supply reference voltage VREF has the voltage level of "0.6 V" at the fourth node N7, the discharge reference voltage VREFdischarge has the voltage level of "0.8 V" at the third node N6 higher than that of the supply reference voltage VREF. Further, when the supply reference voltage VREF has the voltage level of "1.0 V" at the second node N5, the discharge reference voltage VREFdischarge has the voltage level of "1.2 V" at the first node N4 higher than that of the supply reference voltage VREF.

Figure 8:
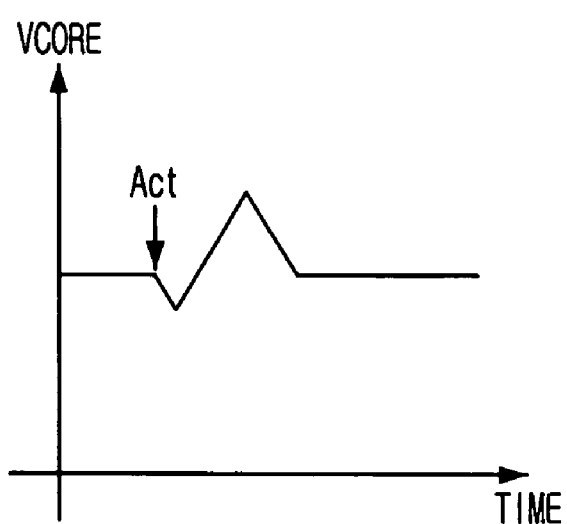
FIG. 8 is a waveform diagram for describing a change in voltage level in accordance with the present invention.

FIG. 8 is a waveform for describing a change in voltage level at the core voltage end VCORE created in accordance with the present invention.

With reference to FIGS. 5 and 8, when an activation signal Act to active the operation of DRAM is input, the core voltage VCORE is decreased by operation of the internal circuit 100 and the sense amplifier over driving portion 210 and the core voltage supplier 220 charge the decreased core voltage VCORE.

In the meantime, the core voltage discharger 230 compares the discharge reference voltage VREFdischarge with the half core voltage and discharges the core voltage VCORE if the half core voltage is higher than the discharge reference voltage VREFdischarge.

At this time, the core voltage discharger 230 receives the discharge reference voltage VREFdischarge higher than the supply reference voltage VREF, which takes into account the response speed delay of the core voltage discharger 230. Accordingly, the core voltage VCORE is discharged by just its target value, thereby keeping the target value and thus a stable state.

As described above, the present invention provides a core voltage discharger with a discharge reference voltage higher than a supply reference voltage, thereby generating a core voltage to be input to an internal circuit more rapidly and stably and also preventing unnecessary charge/discharge operations.

The present application contains subject matter related to Korean patent application Nos. 2005-91565 and 2006-38700, filed with the Korean Intellectual Property Office on Sep. 29, 2005 and Apr. 28, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator for use in a semiconductor memory device, comprising:
a reference voltage generator for generating a first reference voltage and a second reference voltage with a voltage level higher than that of the first reference voltage;
a core voltage supplier for raising a core voltage based on the first reference voltage; and a core voltage discharger for discharging the core voltage based on the second reference voltage;

wherein the reference voltage generator includes a voltage divider for dividing an external voltage to produce first and second divided voltages; a first reference voltage output unit for providing the first divided voltage as the first reference voltage in response to a predetermined division control signal; and a second reference voltage output unit for outputting the second divided voltage as the second reference voltage in response to the predetermined division control signal.

2. The internal voltage generator as recited in claim 1, wherein the first divided voltage has a voltage level lower than that of the second divided voltage.

3. The internal voltage generator as recited in claim 1, wherein the voltage divider includes a plurality of resistors connected between an external voltage and a ground voltage, each of nodes between the resistors having a different voltage level.

4. The internal voltage generator as recited in claim 3, wherein the first reference voltage output unit provides one of the voltage levels at the nodes as the first reference voltage.

5. The internal voltage generator as recited in claim 4, wherein the first reference voltage output unit includes:
a first inverter for receiving and inverting a first division control signal;
a first transfer gate for outputting the voltage level at the second node as the first reference voltage in response to the first division control signal and an output signal of the first inverter;
a second inverter for receiving and inverting a second division control signal;
a second transfer gate for providing the voltage level at the third node as the first reference voltage in response to the second division control signal and an output signal of the second inverter;
a third inverter for receiving and inverting a third division control signal; and
a third transfer gate for outputting the voltage level value at the fourth node as the first reference voltage in response to the third division control signal and an output signal of the third inverter.

6. The internal voltage generator as recited in claim 3, wherein the second reference voltage output unit provides one of the voltage levels at the nodes as the second reference voltage.

7. The internal voltage generator as recited in claim 6, wherein the second reference voltage output unit includes:
a fourth inverter for receiving and inverting a first division control signal;
a fourth transfer gate for outputting the voltage level at the first node as the second reference voltage in response to the first division control signal and an output signal of the fourth inverter;
a fifth inverter for receiving and inverting a second division control signal;
a fifth transfer gate for providing the voltage level at the second node as the second reference voltage in response to the second division control signal and an output signal of the fifth inverter;

a sixth inverter for receiving and inverting a third division control signal; and
a sixth transfer gate for outputting the voltage level at the third node as the second reference voltage in response to the third division control signal and an output signal of the sixth inverter.

8. An internal voltage generator for use in a semiconductor memory device, comprising:
a first reference voltage generator for generating a first reference voltage;
a second reference voltage generator for generating a second reference voltage;
a core voltage generator for raising a core voltage based on the first reference voltage
a core voltage discharger for discharging the core voltage depending on the second reference voltage; and
a voltage divider including a plurality of resistors connected between an external voltage and a ground voltage, each of nodes between the resistors having a different voltage level.

9. The internal voltage generator as recited in claim 8, wherein the first reference voltage generator includes:
a first inverter for receiving and inverting a first division control signal;
a first transfer gate for outputting the voltage level at the second node as the first reference voltage in response to the first division control signal and an output signal of the first inverter;
a second inverter for receiving and inverting a second division control signal;
a second transfer gate for providing the voltage level at the third node as the first reference voltage in response to the second division control signal and an output signal of the second inverter;
a third inverter for receiving and inverting a third division control signal; and
a third transfer gate for outputting the voltage level value at the fourth node as the first reference voltage in response to the third division control signal and an output signal of the third inverter.

10. The internal voltage generator as recited in claim 9, wherein the second reference voltage generator includes:
a fourth inverter for receiving and inverting a first division control signal;
a fourth transfer gate for outputting the voltage level at the first node as the second reference voltage in response to the first division control signal and an output signal of the fourth inverter;
a fifth inverter for receiving and inverting a second division control signal;
a fifth transfer gate for providing the voltage level at the second node as the second reference voltage in response to the second division control signal and an output signal of the fifth inverter;
a sixth inverter for receiving and inverting a third division control signal; and
a sixth transfer gate for outputting the voltage level at the third node as the second reference voltage in response to the third division control signal and an output signal of the sixth inverter.

* * * * *